US006252794B1

(12) United States Patent
Sunaga et al.

(10) Patent No.: US 6,252,794 B1
(45) Date of Patent: Jun. 26, 2001

(54) DRAM AND DATA ACCESS METHOD FOR DRAM

(75) Inventors: Toshio Sunaga, Ohtsu; Shinpei Watanabe, Yokohama, both of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/464,912

(22) Filed: Dec. 16, 1999

(30) Foreign Application Priority Data

Dec. 25, 1998 (JP) .................................................. 10-370358

(51) Int. Cl.[7] .................................................... G11C 11/24

(52) U.S. Cl. .......................................... 365/149; 365/233

(58) Field of Search .................................. 365/149, 233, 365/129, 230.01

(56) References Cited

U.S. PATENT DOCUMENTS

| 5,581,512 | * | 12/1996 | Kitamura | 365/233 |
| 5,600,605 | * | 2/1997 | Schaefer | 365/233 |
| 5,867,447 | * | 2/1999 | Koshikawa | 365/233 |
| 5,923,595 | * | 7/1999 | Kim | 365/189.05 |
| 5,991,223 | * | 11/1999 | Kozaru et al. | 365/230.03 |
| 6,088,291 | * | 7/2000 | Fujioka et al. | 365/233 |

* cited by examiner

Primary Examiner—David Nelms
Assistant Examiner—Hoai V. Ho
(74) Attorney, Agent, or Firm—Robert A. Walsh

(57) ABSTRACT

A DRAM includes a plurality of DRAM cells; sense amplifiers respectively corresponding to the plural DRAM cells; and means for activating merely a sense amplifier corresponding to a cell to be accessed among the plural DRAM cells, so that merely sense amplifiers in a number corresponding to a burst length can be activated. As a result an access time and restore time can be shortened, and a precharge time can be shortened.

8 Claims, 4 Drawing Sheets

F I G. 3
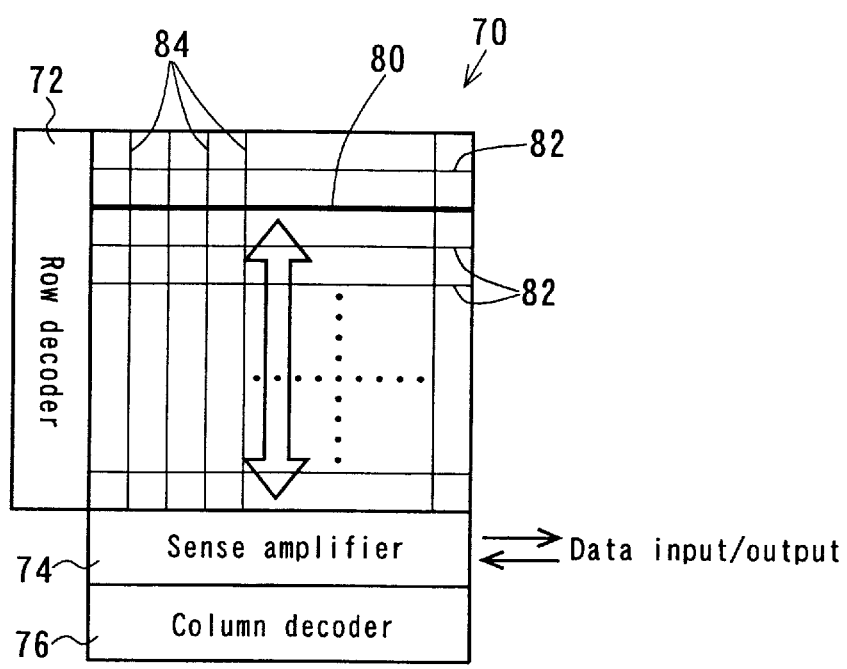

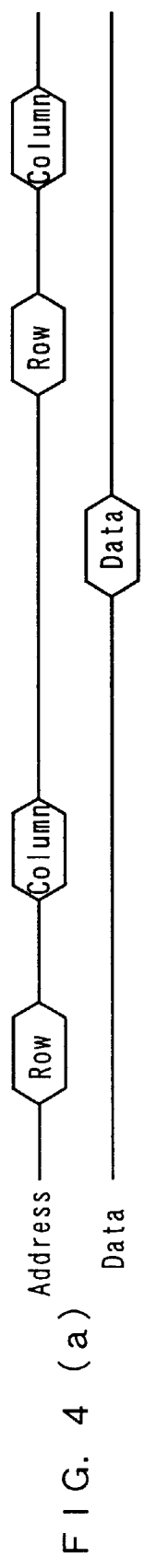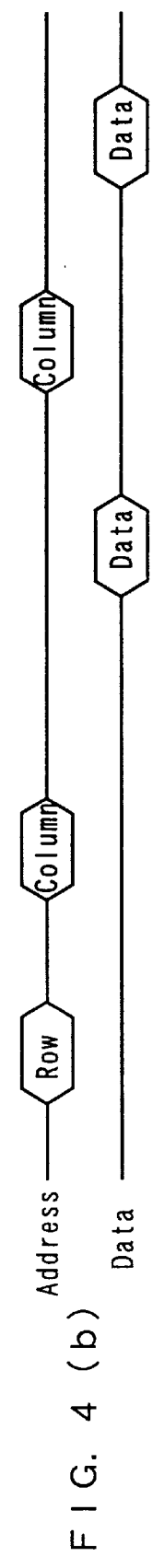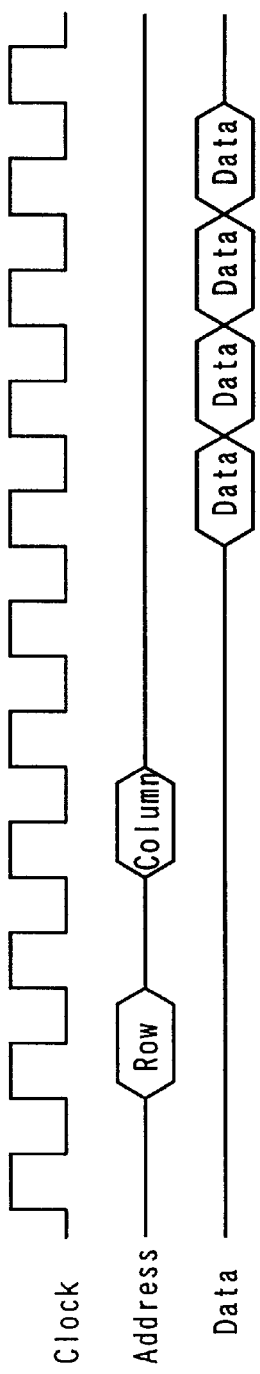
F I G. 4 (a)
F I G. 4 (b)
F I G. 5

DRAM AND DATA ACCESS METHOD FOR DRAM

FIELD OF THE INVENTION

The present invention relates to a DRAM (Dynamic random access memory) and a data access (read/write) method for the DRAM.

BACKGROUND

A dynamic RAM (DRAM) is generally used as a mass storage RAM. In a DRAM, a memory cell is specified by using a row address (corresponding to a word line 82) and a column address (corresponding to a bit line 84) as is shown in FIG. 3, so that data can be written in or read from the specified memory cell. The outline of timing of data read is illustrated in FIG. 4(a). First, an address signal is input to a row decoder 72 so as to specify a row address. Then, all data on a word line 80 corresponding to the specified row address are read through the bit lines 84 to sense amplifiers 74. Next, an address signal is input to a column decoder 76 so as to specify a column address. Then, among the data having been read to the sense amplifiers 74, data on a bit line corresponding to the specified column address is specified to be output. In this manner, data are read or written by specifying a row address and a column address.

However, when data on the same word line (namely, having the same row address) are to be continuously read, the target data are already read to the sense amplifiers, and hence, there is no need to read the data on this word line to the sense amplifiers 74 again. Accordingly, in this case, the outline of timing of data read can be substantially illustrated as in FIG. 4(b). In this manner, when data on the same word line are to be continuously read, merely a column address is specified. Therefore, the data can be more rapidly output than the timing shown in FIG. 4(a).

Moreover, in a synchronous DRAM (SDRAM), an address is automatically generated therein without specifying a column address as shown in FIG. 4(b), so as to output data in synchronization with a clock. The outline of this data read is illustrated in FIG. 5. In this case, by specifying read start addresses (row and column addresses) and a bank, data with a predetermined burst length are continuously output in synchronization with a clock. In this manner, since the SDRAM outputs data every clock, the data can be further rapidly output than in the timing of the page mode shown in FIG. 4(b).

Recently, generation-to-generation improvement in the operation speed of a DRAM is largely behind that of an MPU, and the improvement in the operation speed of a DRAM has become a significant problem. Accordingly, an SDRAM with a large bandwidth has become a leading memory. The bandwidth of an SDRAM is increased by utilizing the burst mode in which data in continuous addresses having a burst length of 2, 4 or 8 bits are written and read from a sense amplifier for latching data on the same word line (namely, having the same row address) in synchronization with a fast clock. However, an SDRAM is scarcely different from a general DRAM in the basic structure as a memory except for the system of continuously outputting data synchronously with a clock. In other words, data read to the sense amplifiers are dealt with in substantially the same manner as in the page mode shown in FIG. 4(b) except that the data can be continuously accessed by a new method such as pipeline processing.

Accordingly, all disadvantages of a general DRAM except for one that can be overcome by continuously dealing with data synchronously with a clock still remain in an SDRAM as disadvantages. For example, access times from the specification of a row address and a column address of an SDRAM are substantially equal to those of a general DRAM. Also, an SDRAM has no specific means for improving a cycle time. Furthermore, since an initial access time and a cycle time are long, it is needless to say that the latency for these processing is long. In addition, when different row addresses are continuously accessed, a long idle time is unavoidably caused in an interval between data processing in the burst mode. Accordingly, there arises a serious problem that a substantial data transfer rate cannot be improved.

Furthermore, in such a DRAM and SDRAM, fast access is realized by specifying a column address alone of data having been latched by the sense amplifier. Accordingly, in order to utilize data on an activated word line as efficiently as possible, a very large page length is generally adopted. For example, a 64-Mbit DRAM has a page length of 512 through 1024 bits, and in the entire chip, 8 k through 16 k (1 k=1024) sense amplifiers are simultaneously activated. However, even when the burst mode is repeated, 256 bits at most are used in an SDRAM, and further fewer bits are used in a DRAM. Thus, an unnecessarily large number of sense amplifiers are activated, and the utilization ratio of the sense amplifiers is very low.

The number of sense amplifiers simultaneously activated tends to be increasing in accordance with the development of generations of DRAMs. The activation of such a large number of sense amplifiers is one of the causes for obstructing a decrease of restore and precharge times and an improvement of the access time and the cycle time. The same is true for an SDRAM, and in such a device in the 64-Mbit class, an RAS (Row address strobe) access time (RAS latency) of 50 through 60 ns, an address access time (CAS (Column address strobe) latency) of 25 through 30 ns and a cycle time of 80 through 90 ns are available at most at present. When these times are long, there arises a long latency time between bursts in making continuous accesses to different row addresses, which makes it difficult to improve the substantial data transfer rate. This leads to a serious problem because a memory will be used with randomly changing row addresses in the multi-task environment further developing.

SUMMARY OF THE INVENTION

An object of the invention is, even in making continuous random row accesses with row addresses changing in every access to a DRAM, minimizing or eliminating a latency time between bursts, so as to attain a substantial data transfer rate approximate to or according with a maximum value obtained based on a clock frequency.

The DRAM of this invention comprises plural DRAM cells; sense amplifiers respectively corresponding to the plural DRAM cells; and means for activating merely a sense amplifier corresponding to a cell to be accessed among the plural DRAM cells.

The data access (read/write) method for a DRAM of this invention comprises the steps of selecting a cell to be accessed among plural DRAM cells; and activating merely a sense amplifier corresponding to the selected cell.

BRIEF DESCRIPTION OF THE DRAWINGS

FIG. 3 is an enlarged view for showing the structure of a main part of an exemplified conventional DRAM.

FIGS. 4(a) and (b) are timing charts for showing the outline of data read from a DRAM.

FIG. 5 is a timing chart for showing the outline of data read from an SDRAM.

DESCRIPTION OF THE PREFERRED EMBODIMENTS

Figure 1:
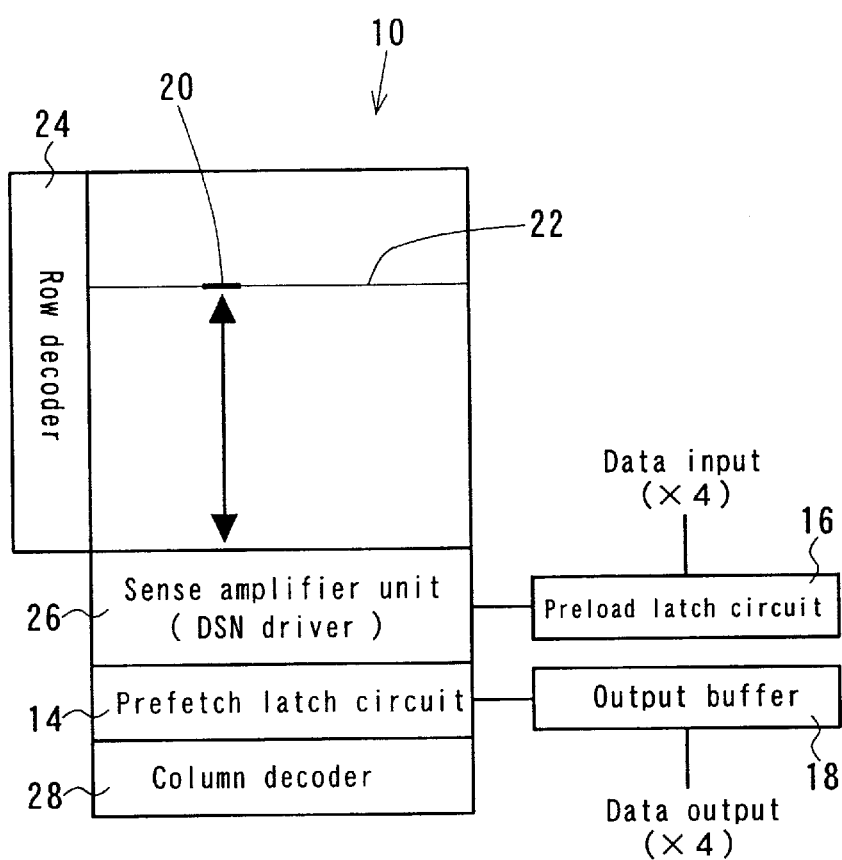
FIG. 1 is an enlarged view for showing the structure of a main part of a DRAM according to the present invention.

FIG. 1 illustrates a ⅛ portion of a DRAM chip according to the present invention. The entire DRAM includes thirty-two inputs/outputs (I/Os), and the DRAM 10 shown in FIG. 1 includes ⅛ of all the I/Os, namely, four I/Os. A word line 22 includes 1 k (1024) memory cells. Also, the DRAM 10 corresponding to the ⅛ portion of the entire DRAM executes burst mode transfer of 8 bits to each of the four I/Os. Accordingly, the number of sense amplifiers simultaneously activated is limited to a number obtained by multiplying a burst length, 8, by the number of I/Os, 4, namely, thirty-two.

Figure 2:
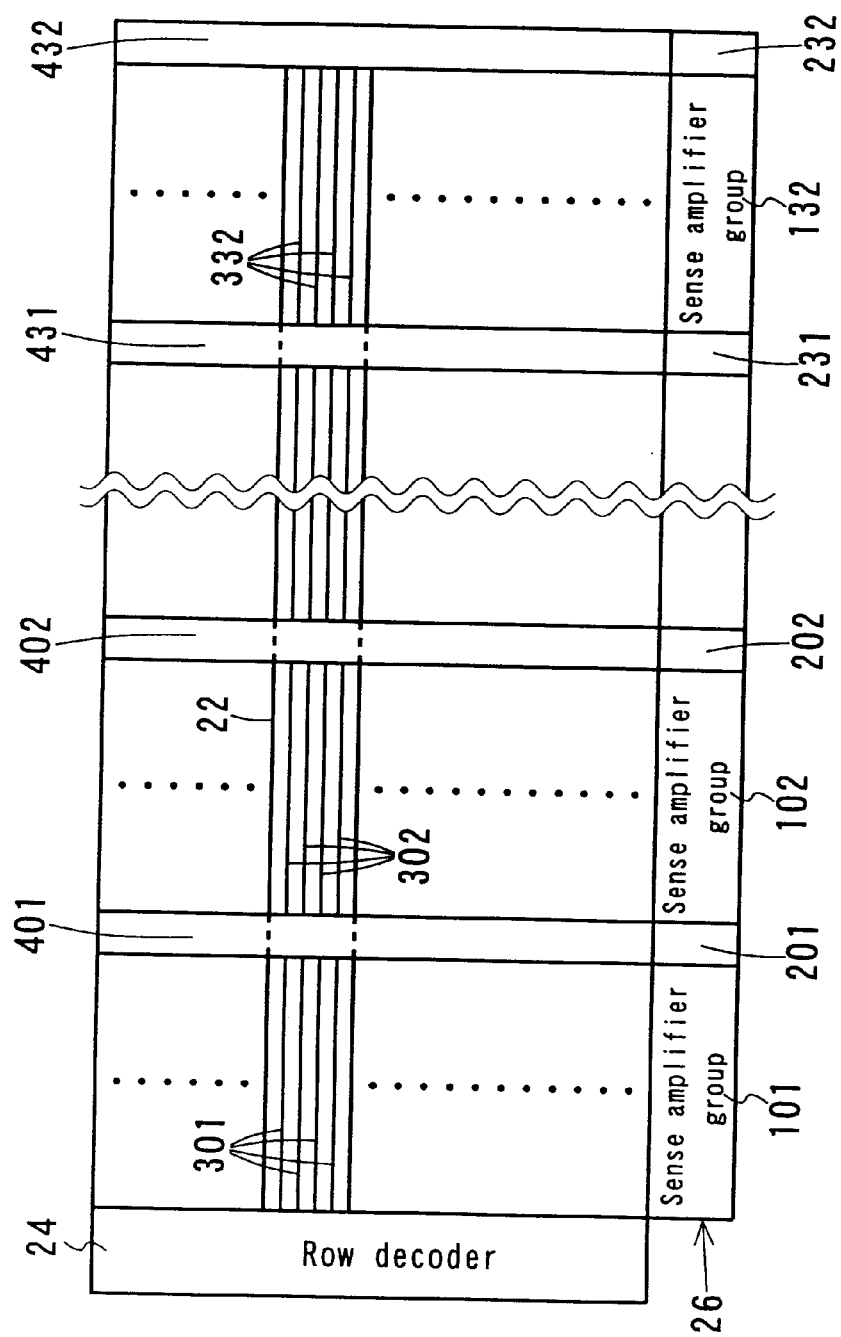
FIG. 2 is an enlarged view for showing the structure of a main part of the DRAM of FIG. 1.

In this embodiment, with respect to the word line 22 including 1 k memory cells, thirty-two memory cells 20 alone are specified by a technique using a segment word line or the like, so as to activate merely sense amplifiers corresponding to the memory cells 20 in a sense amplifier unit 26. FIG. 2 is an enlarged view of the main part of the DRAM 10 of FIG. 1 for illustrating an example of the segment word line. In FIG. 2, the word line 22 extending over all columns is provided with, for example, four short segment word lines 301, 302, ..., and 332. Each of the segment word lines 301, 302, ..., and 332 includes thirty-two memory cells. Furthermore, each group of the segment word lines 301, 302, ..., and 332 corresponding to the same column is provided with a SD (segment decoder) driver 401, 402, ..., or 432 for specifying a segment word line to be accessed.

Also, each group of the segment word lines 301, 302, ..., and 332 corresponds to each of sense amplifier groups 101, 102, ..., and 132. Each of the sense amplifier groups 101, 102, ..., and 132 includes thirty-two sense amplifiers. Each of the sense amplifier groups 101, 102, ..., and 132 is also provided with a DSN (distributed set-node) driver 201, 202, ..., or 232 for activating the thirty-two sense amplifiers included in the group.

Accordingly, for example, one of the segment word lines 301 can be specified by the SD driver 401, so as to activate the sense amplifiers of the sense amplifier group 101 corresponding to the specified word line by the DSN driver 201. Furthermore, the DRAM 10 includes a prefetch latch circuit 14 for receiving data output signals of the sense amplifiers activated by the DSN driver, an output buffer 18 connected with the prefetch latch circuit 14 and a preload latch circuit 16 connected with the sense amplifier unit 26.

Accordingly, merely thirty-two sense amplifiers are driven by using the SD drivers 401, 402, ..., and 432 and the DSN drivers 201, 202, ..., and 232, so as to latch data of the thirty-two memory cells 20 on the word line 22 in the prefetch latch circuit 14, and to read the data in 8-bit burst mode through the output buffer 18 to the four outputs. Also, immediately after prefetching the data in the prefetch latch circuit 14, a precharge is automatically done.

On the other hand, in a write operation, data input to the four inputs in the 8-bit burst mode are once latched by the preload latch circuit 16, and when all the thirty-two data are input, the data are simultaneously written in the thirty-two memory cells 20. Also, after the data are preloaded to the preload latch circuit 16 and written back in a batch, a precharge is automatically done.

In this manner, after the prefetch or write back of data, the precharge is automatically done. Since the DRAM 10 of FIG. 1 corresponds to the ⅛ portion of the entire DRAM, 32×8=256 sense amplifiers are activated in the entire chip. In refresh, all the segment word lines included in the 1 k word lines and the set-node drivers of the sense amplifiers can be driven in accordance with a command, so as to activate 1 k (8 k in the entire chip) sense amplifiers as in the conventional technique.

The DRAM of this embodiment has the thirty-two I/Os as a whole, and when the burst length is 8 bits at maximum, merely 256 sense amplifiers are simultaneously activated in the entire chip. Since no more than 256 sense amplifiers are thus simultaneously activated in the entire chip, a load capacity of each word line and a load capacity of each set-node of the sense amplifiers can largely be decreased. As a result, an access time and a restore time can be shortened, and a precharge time can be largely shortened.

Also, by combining the prefetch or preload with the automatic precharge, the precharge and activation of a row address can be executed during the burst mode transfer of data. A logically minimum cycle time of a memory cell array corresponds to a time from a rise of a word line to the equalization of a bit line, and can be further shortened by simultaneously activating a smaller number of sense amplifiers as described above. Accordingly, the cycle time, which is conventionally approximately 80 ns, can be decreased to 30 ns or less in the DRAM of this invention. This means that different row addresses can be successively accessed in 30 ns or less. Thus, even when the burst length is short, a complete seamless access free from a latency time between bursts can be realized. In other words, without using the conventional page mode at all, a much higher data transfer rate can be realized in accesses to different rows.

Furthermore, in the conventional relationship between the row access time tRAC and the address access time tAA in the page mode (between the RAC latency and the CAS latency in an SDRAM), the row access time tRAC is generally twice as long as the address access time tAA. In accordance with the development of DRAMs, the difference between the tRAC and tAA is decreasing although not largely. In this invention, the page mode commonly used in all the existing systems of DRAM, SDRAM and RAMBUS is not used. Therefore, the number of sense amplifiers simultaneously activated, which is conventionally 8 k through 16 k, can largely be decreased, resulting in shortening the access time and the cycle time. Accordingly, a difference between the row access time tRAC (or the RAS latency) and the address access time tAA (or the CAS latency) can be further decreased in the present invention. Therefore, whichever row address is to be accessed, data can be processed with short latency without using data latched in a large number of sense amplifiers. As a result, the substantial data transfer rate can always be very high.

Also, since the number of activated sense amplifiers is limited in this invention, the operational current can be decreased. As compared with 8 k through 16 k sense amplifiers simultaneously activated in the conventional technique, no more than 256 sense amplifiers are simultaneously activated in this invention, and hence, a charge/discharge current of a bit line can be decreased to 1/64 through 1/32 of that in the conventional technique. Accordingly, as compared with the case where 8 k through 16 k sense amplifiers are activated in 80 ns, the operation current can be much smaller in the DRAM of this invention even when it is operated at a fast cycle time of 30 ns.

Even in making continuous random row accesses with row addresses changing in every access to a DRAM, to minimize or eliminate a latency time between bursts, so as to attain a substantial data transfer rate approximate to or according with a maximum value obtained based on a clock frequency.

According to the DRAM and the data access (read/write) method for the DRAM of this invention, the number of sense amplifiers simultaneously activated is limited to a number corresponding to a burst length. Since the number of sense amplifiers simultaneously activated is thus limited, a precharge time and the like can be shortened, and a cycle time can be shortened. As a result, accesses to different row addresses can be made rapidly.

The embodiment of the DRAM and the data read/write method for the DRAM according to the invention has been described with reference to the drawings so far, but the invention is not limited to those shown in the drawings. For example, the limited number of activated sense amplifiers is not specified, but an arbitrary number of sense amplifiers can be activated in accordance with a burst length, the number of I/Os and the like. In addition, any and all modifications, variations or equivalent arrangements which may occur to those skilled in the art should be considered to be within the scope of the invention.

What is claimed is:

1. A DRAM comprising:
   a plurality of DRAM cells;
   a plurality of sense amplifiers respectively corresponding to said plurality of DRAM cells; and
   means for simultaneously activating a number of sense amplifiers among said plurality of sense amplifiers corresponding to DRAM cells to be accessed among said plurality of DRAM cells, wherein said number corresponds to a burst length.

2. The DRAM according to claim 1,
   wherein said means for simultaneously activating said number of sense amplifiers includes a driver circuit.

3. The DRAM according to claim 2, further comprising:
   a prefetch circuit for receiving data output signals from said number of sense amplifiers sense amplifiers activated by said driver circuit; and
   an output buffer circuit connected with said prefetch circuit.

4. The DRAM according to claim 3, further comprising a preload circuit connected with said number of sense amplifiers.

5. The DRAM according to claim 1, wherein said number corresponds to said burst length multiplied by the number of I/Os for the DRAM.

6. The DRAM according to claim 5, wherein said burst length equals eight bits and the number of I/Os for the DRAM equals thirty-two.

7. A data access method for a DRAM including a plurality of DRAM cells and a plurality of sense amplifiers respectively corresponding to said plurality of DRAM cells, comprising the steps of:
   selecting DRAM cells to be accessed among said plurality of DRAM cells; and
   simultaneously activating a number of sense amplifiers among said plurality of sense amplifiers corresponding to said selected DRAM cells, wherein said number corresponds to a burst length.

8. The DRAM according to claim 7, wherein the step of selecting DRAM cells to be accessed among said plurality of DRAM cells comprises burst mode.

* * * * *